Sept. 11, 1973

K. HENNINGS ET AL 3,758,326

MASK OR ORIGINAL FOR REPRODUCING PATTERNS
ON LIGHT SENSITIVE LAYERS
Filed Jan. 29, 1970

Inventor:
Klaus Hennings
Hans Meyer

BY Spencer & Kaye
ATTORNEYS

United States Patent Office 3,758,326
Patented Sept. 11, 1973

3,758,326

MASK OR ORIGINAL FOR REPRODUCING PATTERNS ON LIGHT SENSITIVE LAYERS

Klaus Hennings and Hans Meyer, Heilbronn, Germany, assignors to Licentia Patent-Verwaltungs-G.m.b.H., Frankfurt am Main, Germany Filed Jan. 29, 1970, Ser. No. 6,881
Claims priority, application Germany, Jan. 31, 1969, P 19 04 789.3
Int. Cl. B44c *1/50;* C03c *17/22*
U.S. Cl. 117—37 R 1 Claim

ABSTRACT OF THE DISCLOSURE

A mask or original for reproducing patterns on light sensitive layers comprises a transparent substrate and a pattern layer on the substrate containing the pattern to be reproduced. This layer has a light transmission depending on the light wavelength and consists of a III/V or a II/VI compound. A method of producing such a mask or original includes applying the layer to the substrate by vapour deposition, cathode sputtering, or pyrolytic deposition.

BACKGROUND OF THE INVENTION

It is known that semiconductor devices are produced by the modern planar technique by diffusing semiconductor regions into specific areas of a semiconductor body, generally from one surface. The diffusion is effected through diffusion windows in a diffusion-inhibiting layer which is present on the semiconductor surface and which consists for example of silicon dioxide or silicon nitride.

The areas diffused into the semiconductor body must have specific geometrical dimensions and be adjusted as precisely as possible in relation to one another as well as in relation to the semiconductor body. Particularly in view of the extremely small dimensions of the areas diffused into the semiconductor body, these requirements can be met by means of the so-called photolacquer technique or photoresist technique wherein a layer of photolacquer is applied to the diffusion-inhibiting layer, exposed in a structured manner by means of a mask, after which an area corresponding to the diffusion window is removed from the layer of photolacquer by means of the developer. The structured photolacquer layer then serves as an etching mask during the etching out of the diffusion window from the diffusion-inhibiting layer, in which case, of course, an etching solution must be used which does not attack the layer of photolacquer but only the diffusion-inhibiting layer.

Structured exposure is understood to mean the following: If the layer of photolacquer consists of a so-called positive lacquer, then during the structured exposure in order to produce a diffusion window, only that area of the photolacquer layer is illuminated which is situated over the future diffusion window and which has to be removed from the layer of photolacquer in order to produce the diffusion window. This is achieved by means of a photomask which is opaque with the exception of an area to be reproduced on the layer of photolacquer, the so-called pattern. Such a photomask may consist, for example, of a glass plate which is blackened with the exception of the pattern. Since the diffusion area is generally very small, substantially the entire glass plate is opaque with this method so that considerable difficulties are involved in adjusting the mask precisely to specific points on the semiconductor body since the mask is opaque except for a very small area and therefore hides the semiconductor body substantially completely. On the other hand so-called negative lacquers are sometimes used instead of the positive lacquers and these differ from the positive lacquers in that, during the development of the layer of photolacquer, it is not the exposed areas which are attacked by the developer but the unexposed areas. When negative lacquers are used instead of positive lacquers, therefore, the entire plate with the exception of the diffusion window area does not have to be blackened during the production of diffusion windows but only the very small diffusion window area has to be blackened so that substantially the whole mask is translucent or transparent. Thus the adjustment is simplified considerably by the use of negative lacquers instead of positive lacquers. Negative lacquers, however, have considerable disadvantages, for example, because they have a lower resolution, a lower sensitivity or a higher pinhole density than positive lacquers.

For this reason, masks have already been proposed which are transmissive for a specific range of light waves but are non-transmissive for another wave range at the area which was described before as blackened or opaque area. That wave range in which the mask is transmissive and which is used for the adjustment of the mask, must be selected so that it does not cause any exposure of the layer of photolacquer which is already present on the diffusion-inhibiting layer during the adjustment of the mask and must naturally not be exposed in the course of this adjustment. The masks which have a different transparency depending on the wavelength of the light used, have the advantage that satisfactory adjustment of the exposure masks over the semiconductor wafer is possible without great expense, even with the use of positive lacquers, by using a light of appropriate wavelength for the adjustment.

The above-mentioned masks, which have a transparency depending on the wavelength, consist of a transparent substrate with an absorbing layer on the surface which is transmissive for a specific wave range but nontransmissive or substantially non-transmissive for another wave range. This layer, which contains the pattern to be transferred to a layer of photolacquer in the form of apertures, consists, according to an earlier proposal, of silicon oxide, for example (SiO). SiO has the disadvantage, however, of not having the required spectral absorption curve. (With SiO, the absorption actually only increases slightly as the wavelength decreases in the spectral range in question whereas for a mask with different transparency, a pronounced low-pass character is needed. In order to obtain the low transparency of $\leqslant 1\%$ in the blocking band with SiO, the thickness of the layer would have to amount to several $\mu$, as a result of which the fineness of the pattern contained therein would in turn be limited.

SUMMARY OF THE INVENTION

It is therefore the object of the invention to provide a mask which does not have these disadvantages.

According to the invention, there is provided a mask or original for reproducing patterns on light-sensitive layers, comprising a transparent substrate and a pattern layer on said substrate containing the pattern to be reproduced, having a light transmission which varies in dependence upon the wavelength of the light, and contains a III/V compound or a II/VI compound.

Satisfactory results are obtained, for example if the layer contains an oxide, sulphide, selenide, phosphide or telluride of the metals zinc, gallium or cadmium. ZnSe, CdS or GaP in particular have a substantially ideal spectral transmission.

A method of producing such masks or originals is also envisaged by the invention.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
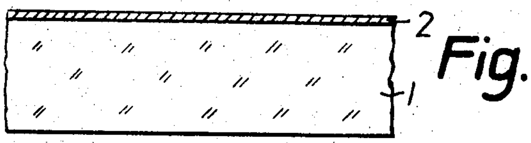
FIG. 1 is a side sectional view of a substrate carrying a layer in accordance with the invention.
Figure 4:
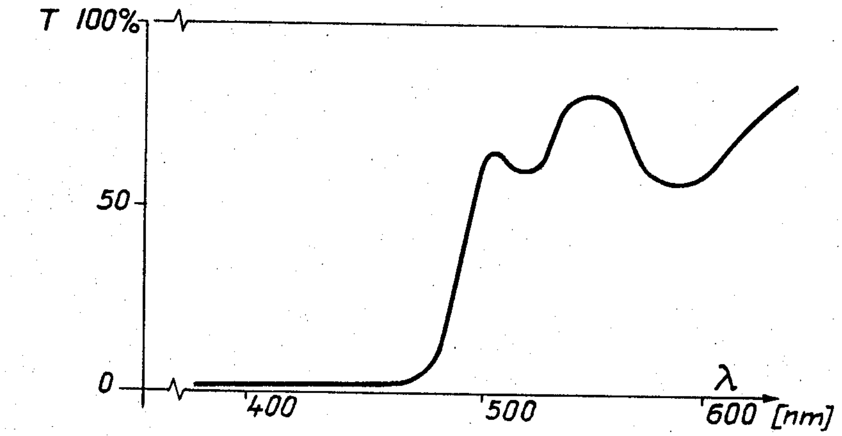
FIG. 4 is graph of transparency (transmission) of light against its wavelength for a typical layer.

FIG. 1 shows a mask of a transparent substrate 1 which consists of glass for example. A layer 2 which contains or consists of one of the substances provided according to the invention is applied to this substrate. The thin layer 2 may be applied to the substrate 1 for example by vacuum deposition using thermal evaporation or cathode sputtering or furthermore by pyrolytic deposition. Of course it is understood that the layer 2 may consist not only of one of the above mentioned materials but also of a mixture of these materials or a mixture with another material, for example silicon oxide. All materials of the mixture can be vacuum deposited at the same time from different evaporators. The thickness of the layer 2 is preferably selected so that the required low transparency, also called transmission, is obtained in the blocking band, which should be about 1% or below. As the curve in FIG. 4 shows, severe periodic fluctuations in the transparency (transmission) occur in the pass band, because of the relatively high refractive index of the materials in question, through thickness interferences at the layer 2 which vary greatly with the thickness of the layer. The precise layer thickness in the range determined by the barrier transmission. 1% is therefore advantageously selected so that a transmission maximum occurs at a preferred wavelength in the pass band, for example 546 nm. When using ZnSe as material for the layer 2, for example, a layer thickness of from 0.5 to 0.8$\mu$ is advantageous and when using CdS, a thickness of layer of from 0.3 to 0.6$\mu$ is advantageous. In general, the layer 2 should be so selected that there is a transmission which is lower by at least the factor 20 in the blocking band than in a pass band which is situated at longer wavelengths.

Figure 2:
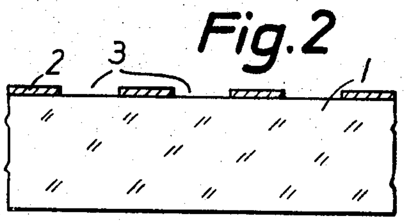
FIG. 2 is a side sectional view similar to FIG. 1 in which the pattern has been provided in the layer.

The mask pattern 3 provided as shown in FIG. 2 is transferred into the thin layer 2 by etching or stripping processes. By stripping process is to be understood a method wherein the required structure is first applied to the substate as a negative in the form of a photolacquer structure and then the surface is completely covered with the thin layer 2. The layer of photolacquer is then caused to swell and is removed by means of a solvent so that the thin layer 2 only remains on the substrate as a positive in the windows of the photolacquer layer.

Figure 5:
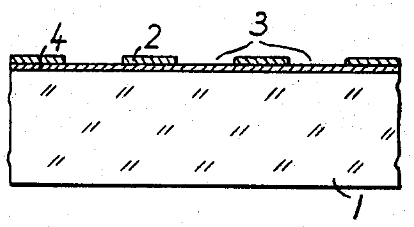
FIG. 5 is a side sectional view of a substrate carrying layers in accordance with another embodiment of the invention.

If the layer 2 requires an etchant, through which the transparent substrate 1 is attacked (for example etching solutions containing HF), the stripping process is preferable. There is also the possibility, however, of passivating the substrate surface as shown in FIG. 5 with a thin etching-resistant layer 4, which consists of tantalum oxide or silicon oxide for example, before the layer 2 is applied to the substrate 1. The optical behavior of this intermediate layer can be chosen by means of its thickness and refractive index, so that the reflection at tho multiple layer is low for light coming from the substrate.

Figure 3:
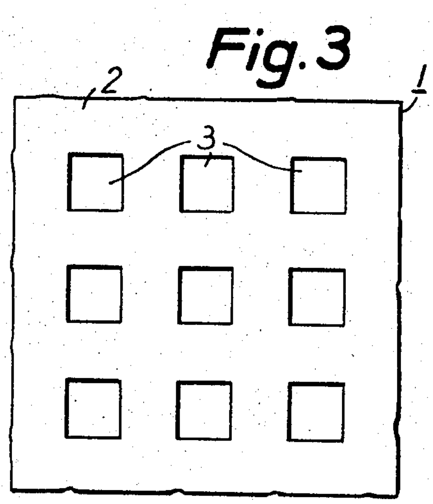
FIG. 3 is a plan view of the substrate as shown in FIG. 2.

FIG. 3 corresponds to the cross-sectional illustration in FIG. 2 and shows the mask provided according to the invention in a plan view. It shows the structure of the pattern introduced into the layer 2. As can be seen from FIG. 3, the pattern consists of a plurality of rectangular apertures 3 which serve to produce a plurality of diffusion windows in an insulating layer on a semiconductor wafer. This pattern must first be transferred to a layer of photolacquer on the insulating layer, however, which then serves as an etching mask during the etching of the diffusion windows in the insulating layer. Finally, diffusion regions are diffused into the semiconductor wafer through the diffusion windows in the insulating layer, each diffusion region generally being allocated to a separate semiconductor device. With the present-day diffusion technique, there is no restriction to a single device in a semiconductor body, and instead numerous diffusion regions for a plurality of individual devices are diffused simultaneously into a correspondingly larger semiconductor wafer.

Figure 6:
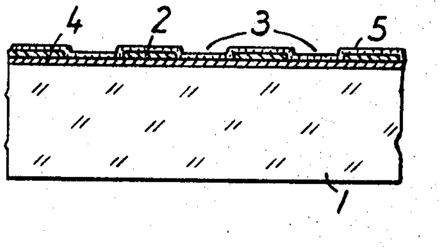
FIG. 6 is a side sectional view of the substrate of FIG. 5 with a protective layer.

When the masks are subjected to severe mechanical stress, such as occurs for example during the transfer of the pattern from the mask to the photolacquer by a contact printing process, and when it is necessary to subject the masks to frequent cleaning, a protective layer 5, which is mechanically and chemically resistant, is preferably provided over the thin optically active layer 2 as shown in FIG. 6. This protective layer, like the etching protective layer in FIG. 5, is naturally of general importance not only in the case of the present invention. Both the covering layer and the protective layer should have as low an absorption as possible. SiO, $SiO_2$, $Si_3N_4$ or SiC are suitable, for example, as materials for the protective layer 5. These materials may again be applied under vacuum, for example by thermal evaporation or by cathode sputtering. The protective layer 5 is preferably only applied after the pattern 3 has been produced in the optically active layer so that it covers both the layer 2 and also the window 3 present therein.

The thickness of layer and the refractive index of the protective layer 5 may be selected in proportion to the refractive indices of the transparent substrate 1 and of the optically active layer 2 so that the protective layer 5 leads to an increase in reflection at the active layer 2 or a decrease of the transmission respectively and a reduction in reflection in the windows 3 on the substrate 1, in relation to a selected wavelength situated in the blocking band of the layer 2. This has the advantage that, as a result, the contrast of the mask is improved. This likewise applies if the mask is illuminated from the rear, that is to say through the substrate. In the simplest case, this condition is achieved by selecting the thickness of the protective layer 5 equal to $m.\lambda/2$ ($m$=integer) and its refractive index between that of the substrate 1 and the active layer 2. This is aided by the fact that ZnSe, CdS and GaP have high refractive indices.

The use of masks which are constructed according to the invention is naturally not restricted to the semiconductor technique and such masks may, of course, also be used to advantage in other fields of technology.

It will be understood that the above description of the present invention is susceptible to various modification, changes and adaptations.

What is claimed is:

1. A mask or original for reproducing patterns on light-sensitive layers, comprising a transparent substrate, a pattern layer and an additional thin layer of a material different from said pattern layer and said substrate, said additional layer being positioned between said pattern layer and said substrate, said additional layer serving to protect said substrate during an etching process for generating the pattern in said pattern layer, and said pattern layer consists of a mixture of at least two compounds selected from the group consisting of oxides, sulphides, selenides, phosphides and tellurides of the metals zinc, gallium and cadmium.

References Cited

UNITED STATES PATENTS

| | | | |
|---|---|---|---|
| 3,510,371 | 5/1970 | Frankson | 156—17 |
| 3,305,385 | 2/1967 | Pizzarello | 117—106 A |
| 3,443,915 | 5/1969 | Wood et al. | 117—45 |
| 2,999,034 | 9/1961 | Heidenhain | 117—45 |
| 3,508,982 | 4/1970 | Shearin, Jr. | 156—17 |

OTHER REFERENCES

Baumeister, Multilayer Filters, Institute of Optics Univ. of Rochester (1964), pp. 20–14 to 20–18.

ALFRED L. LEAVITT, Primary Examiner

M. F. ESPOSITO, Assistant Examiner

U.S. Cl. X.R.

96—36.2; 117—38, 45, 106 A, 124 A, 212; 156—15